United States Patent
Cudak et al.

(10) Patent No.: US 9,679,085 B2
(45) Date of Patent: *Jun. 13, 2017

(54) PRINTING A THREE DIMENSIONAL OBJECT ABOUT A PREFORMED STRUCTURE

(71) Applicant: Lenovo Enterprise Solutions (Singapore) Pte. Ltd., Singapore (SG)

(72) Inventors: Gary D. Cudak, Creedmoor, NC (US); Luis J. Flores, Houston, TX (US); Christopher J. Hardee, Raleigh, NC (US); Xiaoli Shi, Chapel Hill, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 454 days.

This patent is subject to a terminal disclaimer.

(21) Appl. No.: 14/251,900

(22) Filed: Apr. 14, 2014

(65) Prior Publication Data

US 2015/0294030 A1    Oct. 15, 2015

(51) Int. Cl.
    *G06F 19/00*    (2011.01)
    *G06F 17/50*    (2006.01)
    (Continued)

(52) U.S. Cl.
    CPC ......... *G06F 17/50* (2013.01); *B29C 67/0059* (2013.01); *B29C 67/0088* (2013.01); *G05B 19/4097* (2013.01); *G05B 2219/32001* (2013.01)

(58) Field of Classification Search
    None
    See application file for complete search history.

(56) References Cited

U.S. PATENT DOCUMENTS 7,209,797 B2 * 4/2007 Kritchman .......... B29C 67/0059
                                                    700/118
7,369,915 B2 * 5/2008 Kritchman .......... B29C 67/0059
                                                    700/118

(Continued)

FOREIGN PATENT DOCUMENTS

EP    1766585 A1    3/2007
EP    2486547 A1    8/2012

(Continued)

OTHER PUBLICATIONS

Liu et al. "The impact on industrial design by the development of three-dimensional printing technology from a technical perspective", 2010 IEEE, pp. 782-784.*

(Continued)

*Primary Examiner* — Van Nguyen
(74) *Attorney, Agent, or Firm* — Jeffrey L. Streets

(57) ABSTRACT

A computer program product includes a computer readable storage medium having program instructions embodied therewith, wherein the program instructions are executable by a processor to cause the processor to perform a method. The method includes obtaining a data file that includes print instructions for causing a three dimensional printer to print a three dimensional object, wherein the data file describes external surfaces of the object, and providing user instructions for positioning a preformed structure so that the three dimensional printer can print the object around the preformed structure, wherein the preformed structure has a size and a shape to be subsumed within the external surfaces of the object. The method further includes modifying the print instructions so that the printer will print the object around the preformed structure, and printing material around the preformed structure using the modified print instructions to form the object.

18 Claims, 6 Drawing Sheets

(51) Int. Cl.
*G05B 19/4097* (2006.01)
*B29C 67/00* (2017.01)

(56) References Cited

U.S. PATENT DOCUMENTS

| | | | | |
|---|---|---|---|---|
| 7,373,214 | B2* | 5/2008 | Silverbrook | B22F 3/008 700/110 |
| 7,725,209 | B2* | 5/2010 | Menchik | B29C 67/0059 347/86 |
| 7,833,001 | B2* | 11/2010 | Silverbrook | B22F 3/008 264/113 |
| 7,958,841 | B2* | 6/2011 | Kritchman | B29C 41/02 118/305 |
| 9,017,589 | B2* | 4/2015 | Kritchman | B29C 41/02 264/112 |
| 9,076,082 | B1* | 7/2015 | Cudak | G06K 15/00 |
| 9,076,097 | B1* | 7/2015 | Cudak | G06K 15/00 |
| 9,085,109 | B2* | 7/2015 | Schmehl | B33Y 10/00 |
| 9,280,616 | B2* | 3/2016 | Cudak | G06F 17/50 |
| 2003/0151167 | A1* | 8/2003 | Kritchman | B29C 67/0059 264/401 |
| 2008/0006966 | A1* | 1/2008 | Mannella | B29C 67/0055 264/259 |
| 2009/0173443 | A1* | 7/2009 | Kozlak | B29C 67/0062 156/303.1 |
| 2010/0121475 | A1 | 5/2010 | Lyons | |
| 2013/0193621 | A1* | 8/2013 | Daya | A61K 9/70 264/401 |
| 2013/0316081 | A1* | 11/2013 | Kovalcik | B22F 3/1055 427/265 |
| 2014/0031967 | A1* | 1/2014 | Unger | B33Y 50/02 700/119 |
| 2015/0057784 | A1* | 2/2015 | Butler | B29C 67/0088 700/119 |

FOREIGN PATENT DOCUMENTS

| | | |
|---|---|---|
| WO | WO2010011911 A2 | 1/2010 |
| WO | WO2012085914 A1 | 6/2012 |

OTHER PUBLICATIONS

Lumpkins "Printing in the Third Dimension", 2013 IEEE, pp. 48-49.*
Leslie Horn, "Spectacular 3D Printer Failures (http://gizmodo.com/11-spectacular-3d-printerfailures-511092085)" 11 Spectacular 3D Printer Failures, http://gizmodo.com/11-spectacular-3d-printer-failures, Jun. 4, 2013, 14 pages.
Weiming Wang et al., "Cost-effective Printing of 3D Objects with Skin-Frame Structures", Cost-effective 3D Printing, http://staff.ustc.edu.cn/~lgliu/Projects/2013_SigAsia_3DPrinting/default.htm, ACM Transactions on Graphics (Proc. SIGGRAPH Aisa), 32(5), 2013, Oct. 18, 2013, 5 pages.
Olivia Williams, "An Aston Martin that won't cost the Earth! Computer programmer begins work on replica of 1961 classic with the help of a 3D printer", Published: 12:32 EST, Aug. 4, 2013, http://www.dailymail.co.uk/sciencetech/article-2384439/An-Aston-Martin-wont-cost-Earth, 18 pages.
April Nowicki, "Can 3-D Printing and Recycling Come Together?" Can 3-D Printing and Recycling Come Together? : Greentech Media, http://www.greentechmedia.com/articles/read/3-d-printing-a-recycling-m . . . , Aug. 19, 2013, 4 pages.

* cited by examiner

PRINTING A THREE DIMENSIONAL OBJECT ABOUT A PREFORMED STRUCTURE

BACKGROUND

Field of the Invention

The present invention relates to methods of three-dimensional printing.

Background of the Related Art

Three-dimensional (3D) printing is a process of making a three-dimensional object from a digital model using an additive process, where successive layers of material are laid down over previous layers. The material may be a thermoplastic polymer filament that is heated and extruded through a narrow nozzle. In one type of three dimensional printer, the nozzle, the table supporting the material, or both is moved to control where the material is deposited. Other types of three dimensional printers may use alternative mechanisms to control the position of a nozzle for dispensing the material.

3D printing is becoming a big industry with a growing number of printer manufacturers and web sites that provide construction plans in the form of a data file for downloading to a computer. Unfortunately, 3D printing is much more complex than 2D printing and requires much more time to produce an object. Objects that are printed at a fine level of detail and are not tiny can take many hours to complete. Ideally, a 3D print job is not started unless there is enough time and materials to complete the job.

BRIEF SUMMARY

One embodiment of the present invention provides a computer program product comprising a computer readable storage medium having program instructions embodied therewith, the program instructions executable by a processor to cause the processor to perform a method. The method comprises obtaining a data file that includes print instructions for causing a three dimensional printer to print a three dimensional object, wherein the data file describes external surfaces of the object, and providing user instructions for positioning a preformed structure so that the three dimensional printer can print the object around the preformed structure, wherein the preformed structure has a size and a shape to be subsumed within the external surfaces of the object. The method further comprises modifying the print instructions so that the printer will print the object around the preformed structure, and printing material around the preformed structure using the modified print instructions to form the object.

DETAILED DESCRIPTION

Figure 1:
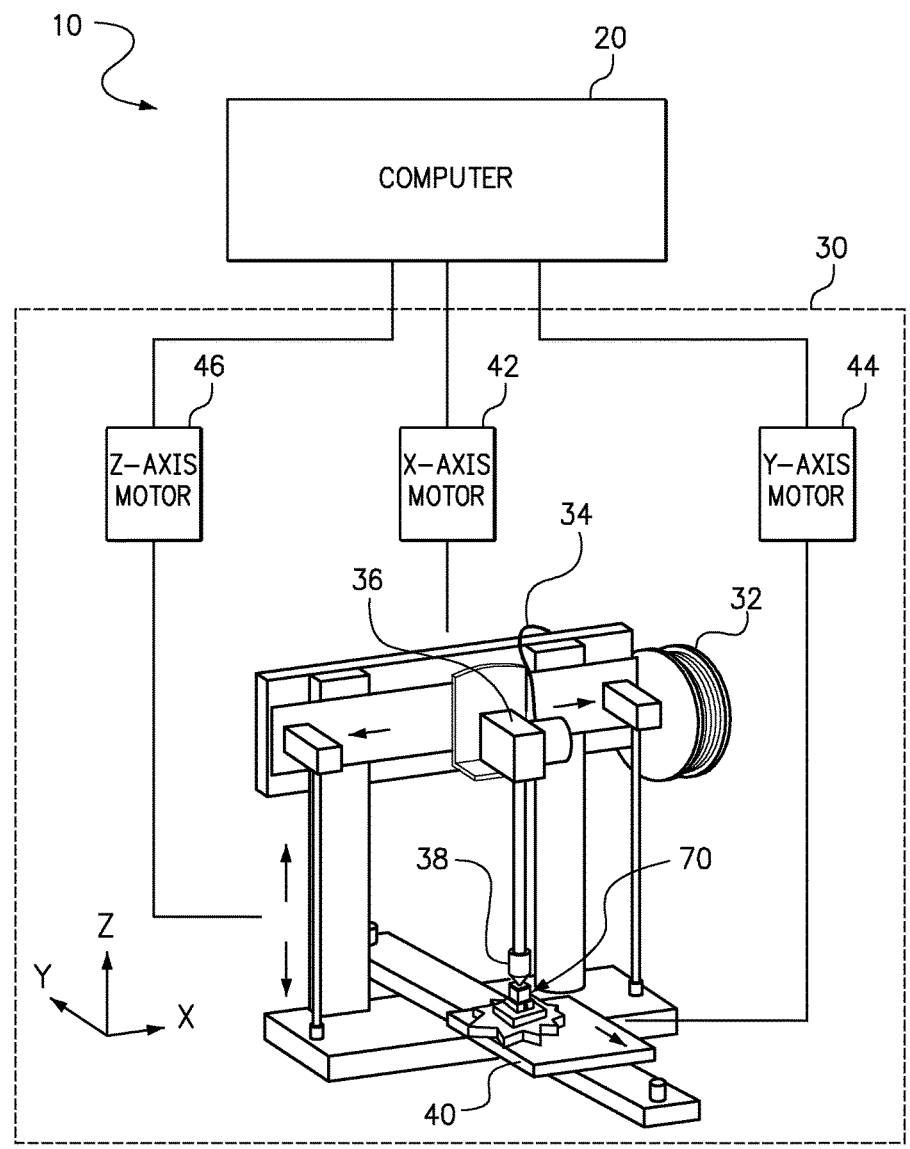
FIG. 1 is a diagram of a computer controlling a three-dimensional printer.

One embodiment of the present invention provides a method that comprises obtaining a data file that includes print instructions for causing a three dimensional printer to print a three dimensional object, wherein the data file describes external surfaces of the object, and providing user instructions for positioning a preformed structure so that the three dimensional printer can print the object around the preformed structure, wherein the preformed structure has a size and a shape to be subsumed within the external surfaces of the object. The method further comprises modifying the print instructions so that the printer will print the object around the preformed structure, and printing material around the preformed structure using the modified print instructions to form the object. Preferably, printing material around the preformed structure reduces the amount of time and material required for the three-dimensional printer to form the object.

The user instructions may be predetermined instructions that are part of the data file. Optionally, the user instructions may be provided each time that the print instructions are executed, so that a preformed structure is always positioned for inclusion in the object. The preformed structure may be the same shape and size each time the object is printed, or the preformed structure may vary so long as it can be subsumed within the completed object. In a further option, the user instructions are provided in response to determining that a remaining amount of print material available to form the object is less than required to form the object, or determining that the amount of time required to form the object is greater than a time setpoint.

Optionally, the preformed structure may have a predetermined size and shape for use in printing the object, such that the data file includes modified or alternative print instructions to account for presence of the preformed structure. If the user provides input indicating that the predetermined preformed structure has been positioned in accordance with the user instructions, then the modified or alternative print instructions are followed to complete the object around the predetermined preformed structure. For example, a preferred preformed structure may have dimensions and weight that, when positioned in accordance with the user instructions, will provide the printed object with a desired center of gravity. Still further, the data file for printing an object may include multiple possible positions where a preformed structure may be inserted. When printing has proceeded to one of these insertion points, the user may be prompted to include the preformed structure and provide some indication whether the preformed structure was or was not included before the printing continues.

Alternatively, the preformed structure may be a random size and shape that is available, although the size and shape must allow the preformed structure to be subsumed within the object. When a random preformed structure is used, the method may include scanning the preformed structure after positioning the preformed structure in the three-dimensional printer in order to determine the actual positioning and contour of the preformed structure. Printing material around the preformed structure to form the object may then include modifying control of the three-dimensional printer to adjust to the actual positioning and contour of the preformed structure.

In another embodiment, the method may maintain an inventory of preformed structures that are available to be positioned in the three dimensional printer, and select one of the preformed structures from the inventory to be the preformed structure that is positioned into the three dimensional printer to be included in the object. The selected preformed structure may be identified by having a size that can be subsumed within the object. For example, the preformed structure may have been previously printed on the three dimensional printer, such that the three dimensional printer or attached memory may know the exact dimensions and mass of the preformed structure. Optionally, the preformed structure may be defective for its intended purpose, such that its best use is recycling into another object. Defective structures may, for example, result from mechanical failures of the printer, improper manufacturing conditions, poor software design or settings, or interruptions in the printer operation.

Optionally, the three dimensional printer, or a computer system sending print jobs to the three dimensional printer, may store data regarding objects that were previously printed with any one or more three dimensional printers. Accordingly, the printer or computer system may store the dimensions and weight of those previous objects that may be reused or recycled as a preformed structure to be subsumed within an object to be printed, and may also store an indication whether the previous object was defective or incomplete in some manner. Still further, the preformed structure may be a previous object that has no further use, has exceeded its intended life cycle, or has passed an expiration date. A particular preformed structure may also be identified using a radio frequency identification (RFID) tag or other identification system in order to find stored information about the preformed structure.

The user instructions may include recommended dimensions and weight for user selection of a preformed structure that can be subsumed into the object. The user instructions may also identify a position for placement of the preformed structure. Optionally, the user instructions may be output to a display screen and include an illustration of a desired position for the preformed structure. In a further option, the printer may include a light that projects an indication of a target position and orientation for the preformed structure.

The print instructions for printing the object are modified to account for the preformed structure, such as printing around the preformed structure. Alternatively, the print instructions may be modified to form an internal void in one portion of the object in response to positioning the preformed structure in another portion of the object, or to leave voids in a portion of the object to offset additional weight of the preformed structure.

The task of printing material onto the preformed structure may include printing material onto upward-facing and side-facing surfaces of the preformed structure. Furthermore, the task of printing material onto the preformed structure may include printing material onto surfaces of the preformed structure until the preformed structure is subsumed within the interior of the object. In one option, the preformed structure is selected so that the object will have at least a minimum depth of printed material around the preformed structure.

In one option, the preformed object may be positioned as a starting point prior to printing any material. In another option, the method may include printing a base portion of the object prior to positioning the preformed structure into the three-dimensional printer on the base portion. After positioning the preformed structure into the three-dimensional printer on the base portion, the method will continue to print the object. The base portion may be a simple layer of the material or a complex three-dimensional structure.

Another embodiment of the present invention provides a computer program product comprising a computer readable storage medium having program instructions embodied therewith, the program instructions executable by a processor to cause the processor to perform a method. The method comprises obtaining a data file that includes print instructions for causing a three dimensional printer to print a three dimensional object, wherein the data file describes external surfaces of the object, and providing user instructions for positioning a preformed structure so that the three dimensional printer can print the object around the preformed structure, wherein the preformed structure has a size and a shape to be subsumed within the external surfaces of the object. The method further comprises modifying the print instructions so that the printer will print the object around the preformed structure, and printing material around the preformed structure using the modified print instructions to form the object.

The foregoing computer program product may further include program instructions for implementing or initiating any one or more aspects of the methods described herein. Accordingly, a separate description of the methods will not be duplicated in the context of a computer program product.

FIG. 1 is a diagram of a system 10 including a computer 20 controlling a three-dimensional printer 30. This three-dimensional printer 30 includes a filament spool 32 for supplying a plastic filament 34 into an extruder 36. The heated plastic is pushed through a nozzle 38 onto a print bed or table 40 where the object is printed. As shown, the object 70 has already received a number of layers of plastic material, such that the nozzle is some distance above the table 40.

The position of the tip of the nozzle 38 determines where a thin layer of the plastic material will be placed. As the plastic passes through the nozzle 38, the nozzle 38 may be moved back and forth along an X-axis by an X-axis motor 42, and the table 40 may be moved back and forth along a Y-axis by a Y-axis motor 44. As each layer has been completed in the X-Y plane, the table may be moved down along a Z-axis by a Z-axis motor 46 so that another layer of the plastic may be applied through the nozzle moving in along the X-axis while the object or work piece is moved along with the table along the Y-axis. The printer also includes structural members that guide the nozzle along the X-axis, guide the table along the Y-axis, and guide the table along the Z-axis. The computer 20 provides instructions to the printer 30 to operate the X-axis motor 42, the Y-axis motor 44, and the X-axis motor 46 in a manner that positions the nozzle 38 where is can progressively build the object.

Figure 2:
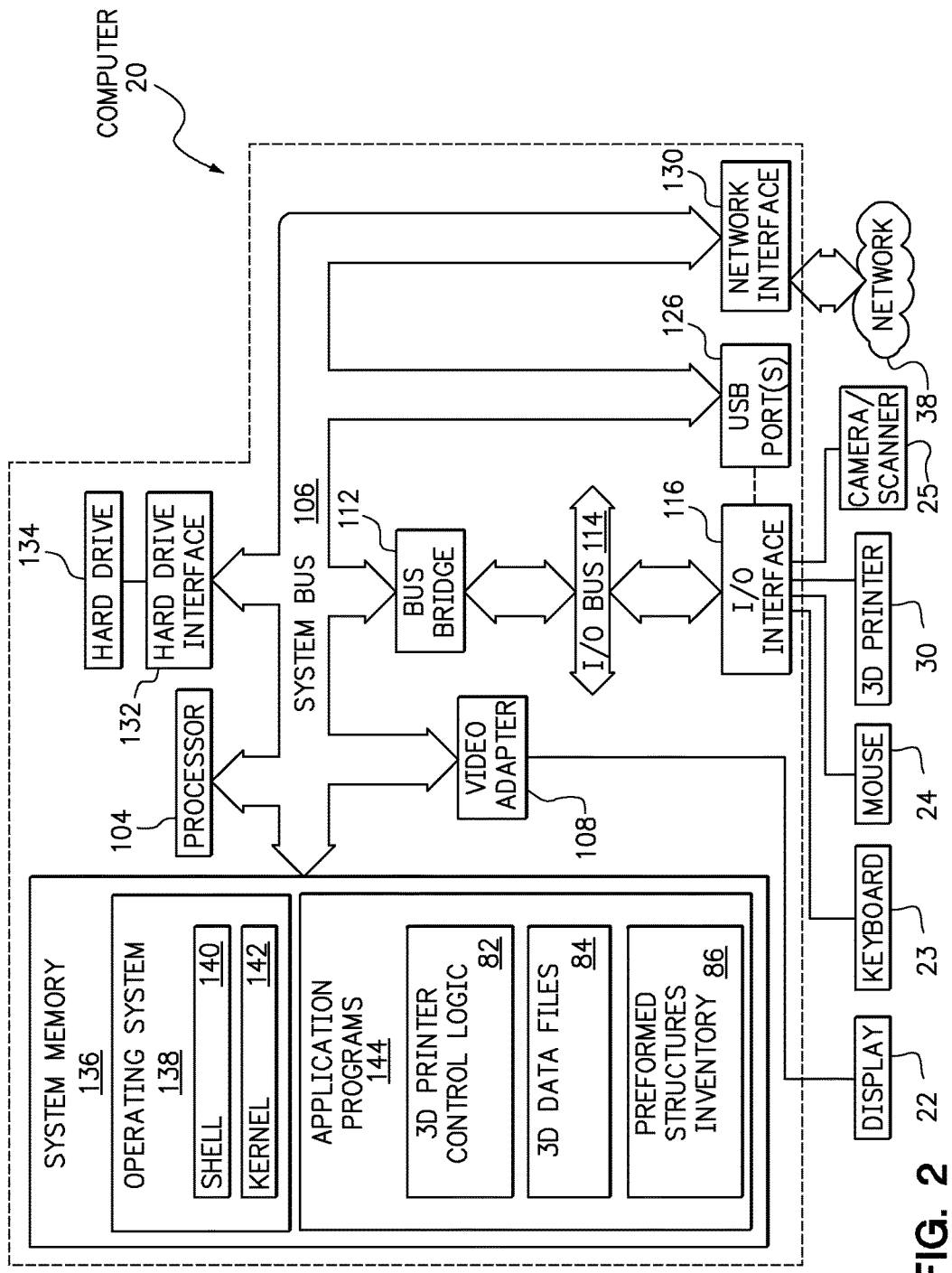
FIG. 2 is a diagram of a computer according to one embodiment of the present invention.

FIG. 2 is a diagram of an exemplary computer 20 that may be used in accordance with one embodiment of the present invention. The computer 20 includes a processor unit 104 that is coupled to a system bus 106. Processor unit 104 may utilize one or more processors, each of which has one or more processor cores. A video adapter 108, which drives/supports a display 22, is also coupled to system bus 106. The system bus 106 is coupled via a bus bridge 112 to an input/output (I/O) bus 114. An I/O interface 116 is coupled to I/O bus 114. I/O interface 116 affords communication with various I/O devices, including a keyboard 23, a mouse 24, a camera 25 and a 3D printer 30. The I/O devices may optionally include storage devices, such as CD-ROM drives and multi-media interfaces, other printers, and external USB port(s). While the format of the ports connected to I/O interface 116 may be any known to those skilled in the art of computer architecture, in a preferred embodiment some or all of these ports are universal serial bus (USB) ports. As depicted, the computer 20 is able to communicate over a network 38 using a network interface 130. The network 38 may be an external network, such as the global communication network, and perhaps also an internal network such as an Ethernet LAN or a virtual private network (VPN).

A hard drive interface 132 is also coupled to system bus 106 and interfaces with a hard drive 134. In a preferred embodiment, the hard drive 134 populates a system memory 136, which is also coupled to system bus 106. System memory is defined as a lowest level of volatile memory in computer 100. This volatile memory includes additional higher levels of volatile memory (not shown), including, but not limited to, cache memory, registers and buffers. Data that populates system memory 136 includes the computer's operating system (OS) 138 and application programs 144.

The operating system 138 includes a shell 140, for providing transparent user access to resources such as application programs 144. Generally, the shell 140 is a program that provides an interpreter and an interface between the user and the operating system. More specifically, the shell 140 executes commands that are entered into a command line user interface or from a file. Thus, the shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, the OS 138 also includes a kernel 142, which includes lower levels of functionality for OS 138, including providing essential services required by other parts of OS 138 and application programs 144, including memory management, process and task management, disk management, and mouse and keyboard management. The application programs 144 in the system memory of the computer 20 may include various programs and modules for implementing the methods described herein, such as the 3D printer control logic 82, the 3D data files 84, and a preformed structures inventory 86.

The hardware elements depicted in computer 20 are not intended to be exhaustive, but rather are representative components suitable to perform the processes of the present invention. For instance, computer 20 may include alternate memory storage devices such as magnetic cassettes, digital versatile disks (DVDs), Bernoulli cartridges, and the like. These and other variations are intended to be within the spirit and scope of the present invention.

Figure 3A:
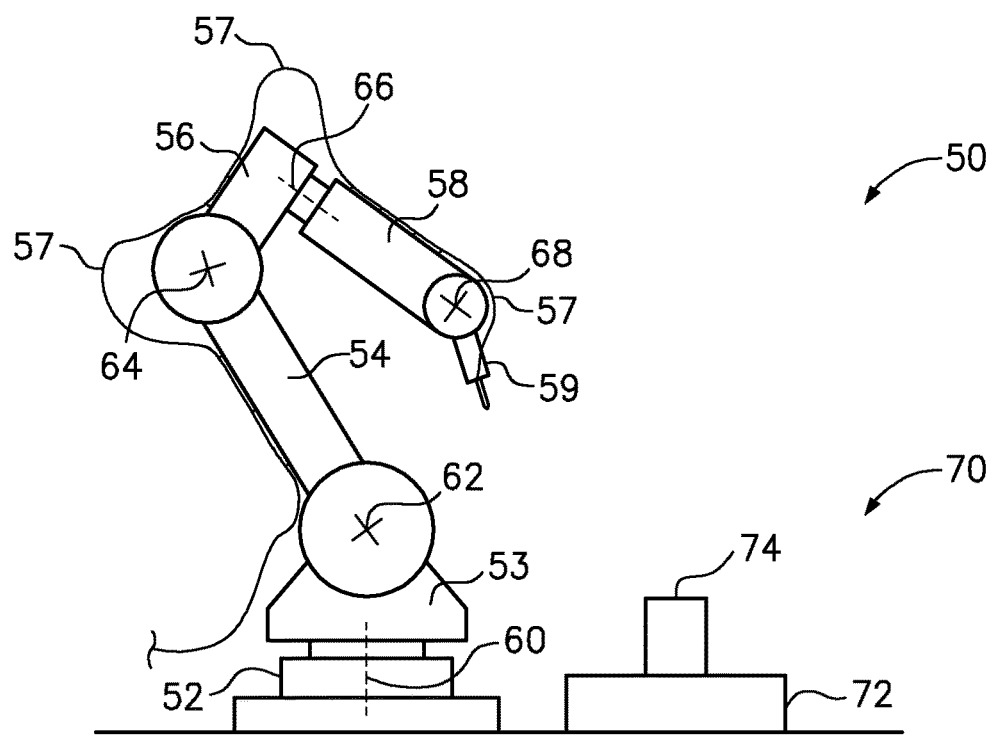
FIGS. 3A-B are diagrams of an alternative three-dimensional printer.
Figure 3B:
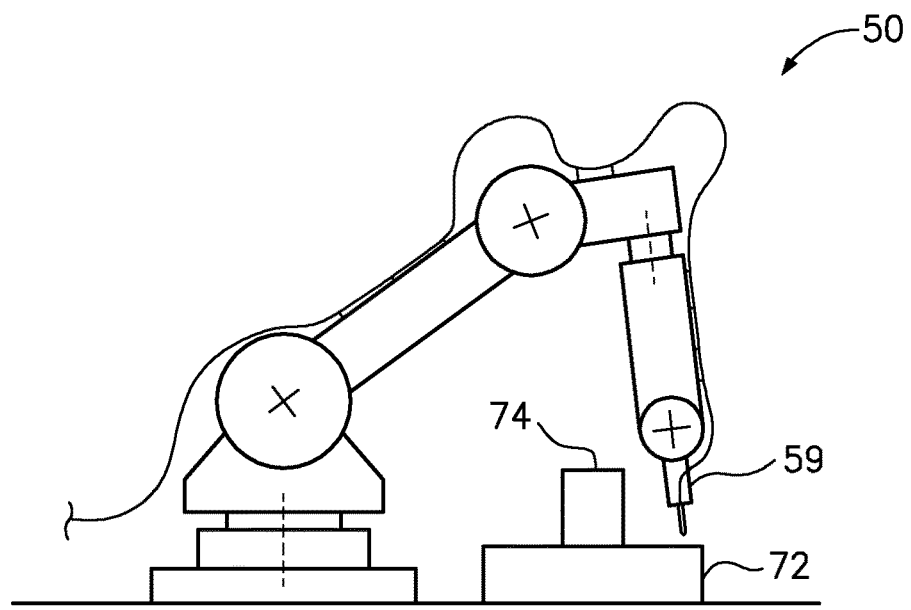

FIGS. 3A-B are diagrams of an alternative three-dimensional printer 50. The 3D printer 50 has a stable base 52 and various arms 54, 56, 58. The base and the arms are pivotally coupled with various axis. For example, the base 52 has a vertical axis 60 so that an upper portion 53 of the base, as well as the entire assembly above the upper portion 53, can rotate. The upper portion 53 of the base and the first arm 54 are pivotally coupled about a first horizontal axis 62, and the first arm 54 is pivotally coupled to the second arm 56 about a second horizontal axis 64. The second arm 56 and the third arm 58 are pivotally coupled about the axis 66, which is perpendicular to the axis 66. Further still, the nozzle 59 is pivotally coupled to the third arm 58 about the axis 68. The pivot angle between each pair of the foregoing components can be independently controlled by a motor receiving control signals from a computer or similar controller. Accordingly, the tip of the nozzle 59 can be positioned to dispense material in three-dimensions and in various angular orientations. In the embodiment shown, the material is delivered to the nozzle 59 through a tube 57 from a material source (not shown).

As shown in FIG. 3A, the incomplete object 70 includes a base portion 72 and a preformed structure 74. As shown in FIG. 3B, the three-dimensional printer 50 has moved under computer control to position the nozzle 59 to continue printing material onto the base 72 around the preformed structure 74. The flow of material through the nozzle 59 may be controlled by a pump (not shown) and/or a valve (not shown) receiving control signals from the computer.

Figure 4A:
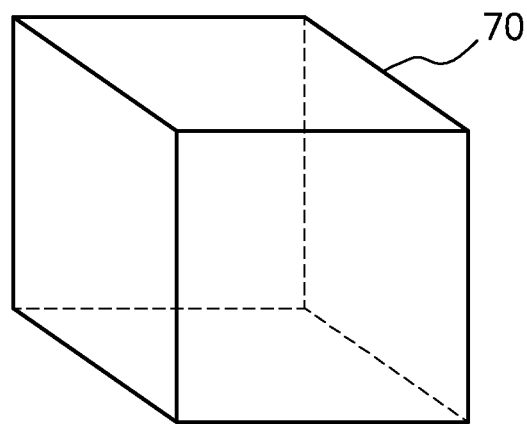
FIGS. 4A-C are diagrams of a three-dimensional object to be printed, a preformed structure positioned on a base portion of the three-dimensional object, and the completed three-dimensional object printed around the preformed structure.
Figure 4B:
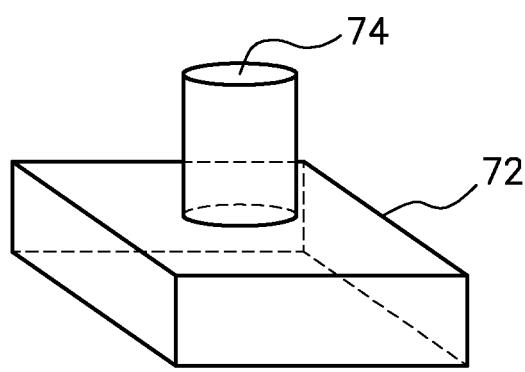
Figure 4C:
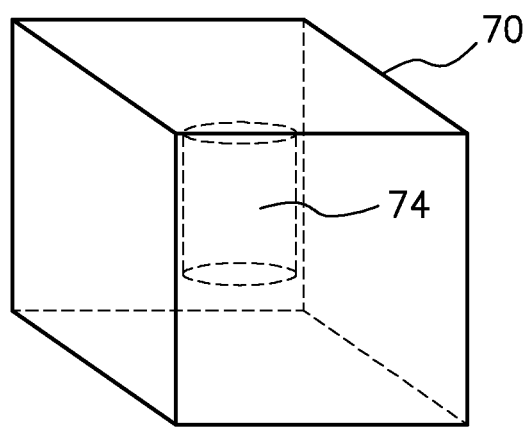

FIG. 4A is a diagram of a three-dimensional object 70 to be printed in accordance with a data file that describes the external surfaces of the object and how to print the object. FIG. 4B is a diagram of a preformed structure 74 positioned on a base portion 72 of the three-dimensional object 70 (FIG. 2). Here, the printing has paused and the preformed structure 74 has been positioned in accordance with user instructions provided by the data file so that the three dimensional printer can print the object around the preformed structure, wherein the preformed structure has a size and a shape to be subsumed within the external surfaces of the object. Accordingly, the print instructions are modified so that the printer will print the object around the preformed structure. FIG. 4C is a diagram of the completed three-dimensional object 70 printed around the preformed structure 74 using the modified print instructions. Although the three-dimensional object 70 (cube) and the preformed structure 74 (cylinder) are shown as very simple shapes, they are representative of a relationship in which the preformed structure 74 is subsumed in the three-dimensional object 70. In actual use, it is expected that one or both of the object and preformed structure will be more complex shapes.

FIGS. 5A-D are examples of suitable and unsuitable preformed structures for inclusion in a particular three-dimensional object to be printed. Using a data file that describes or defines the external surfaces or boundaries of the three-dimensional object to be printed, a three dimensional printer or computer providing a print job to the printer may provide dimensions of a suitable preformed structure that may be subsumed within the object. Where there is a data file also describing the dimensions of one or more preformed structures, the printer or computer may select a preformed object that is suitable for inclusion in the object.

Figure 5A:
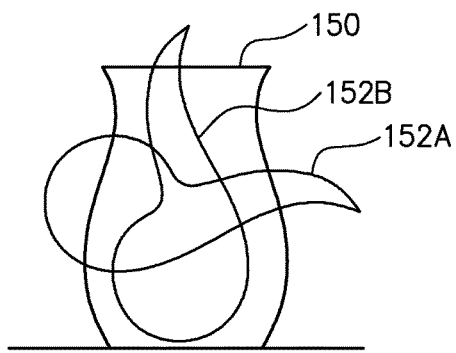
FIGS. 5A-D are examples of suitable and unsuitable preformed structures for inclusion in a particular three-dimensional object to be printed.

FIG. 5A illustrates a three-dimensional object 150 to be printed and a candidate preformed structure in a first orientation 152A and a second orientation 152B. As can be seen, this preformed structure is unsuitable because it is too big (long) to be subsumed within the object 150.

Figure 5B:
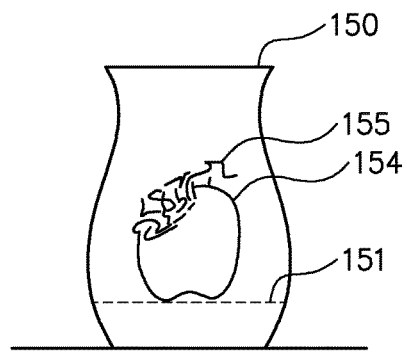

FIG. 5B illustrates the same three-dimensional object 150 to be printed and another candidate preformed structure 154 (a defectively printed apple) that is clearly subsumed within the boundaries of the object 150. If this conclusion is confirmed in all three dimensions, then the preformed structure 154 is suitable for inclusion in the object 150. While not required, the preformed structure 154 has been positioned on a base portion 151 so that the structure 154 is more centered within the object 150 as a whole.

Figure 5C:
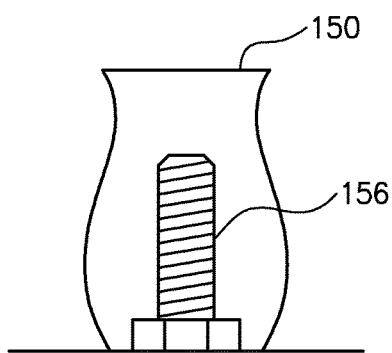

FIG. 5C illustrates the three-dimensional object 150 to be printed and a candidate preformed structure 156 (a bolt-like structure). If this conclusion is confirmed in all three dimensions, then the preformed structure 156 is suitable for inclusion in the object 150. In this illustration, the preformed structure 156 is still subsumed in the object 150, but may have been positioned in a print area prior to any printing. Accordingly, the preformed structure 156 forms part of the base of the object and would be viewable upon handling of the completed object 150. However, the structure is considered to be subsumed within the object since the structure does not extend beyond the boundaries of the object. If this is undesirable, then a base portion (as in FIG. 5B) could be printed prior to positioning the structure.

Figure 5D:
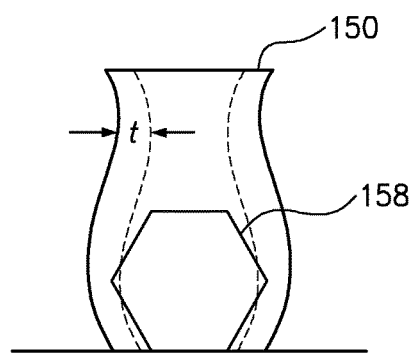

FIG. 5D illustrates the three-dimensional object 150 to be printed and a candidate preformed structure 158 (having a hexagonal cross-section). In the cross-section shown, it appears that the preformed structure 158 would be subsumed within the object 150. While this should be confirmed in all three dimensions, FIG. 5D illustrates a further requirement of having at least a minimum depth or thickness (t) of printed material around the preformed structure. As shown, the preformed structure 158 is still subsumed in the object 150, but is nonetheless unsuitable because it fails to meet the minimum depth requirement.

Figure 6:
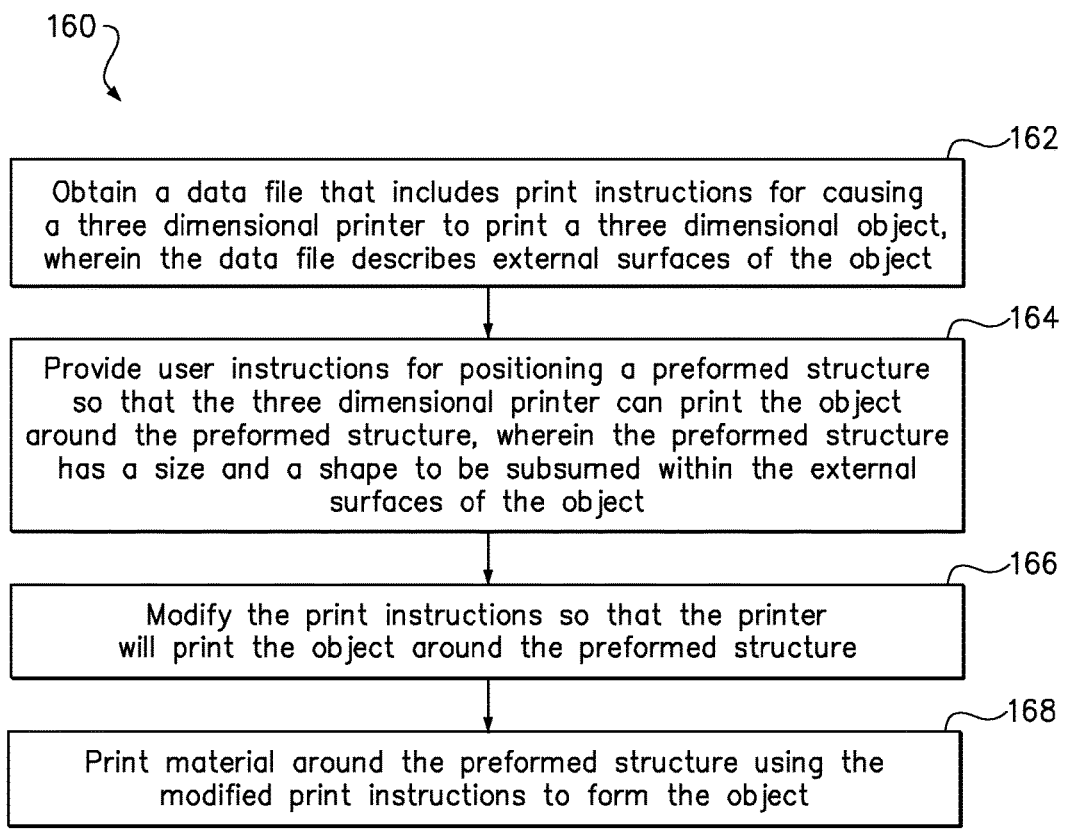
FIG. 6 is a flowchart of a method in accordance with one embodiment of the present invention.

FIG. 6 is a flowchart of a method 160 in accordance with one embodiment of the present invention. Step 162 includes obtaining a data file that includes print instructions for causing a three dimensional printer to print a three dimensional object, wherein the data file describes external surfaces of the object. Step 164 provides user instructions for positioning a preformed structure so that the three dimensional printer can print the object around the preformed structure, wherein the preformed structure has a size and a shape to be subsumed within the external surfaces of the object. The print instructions are modified, in step 166, so that the printer will print the object around the preformed structure. Then, in step 168, the method prints material around the preformed structure using the modified print instructions to form the object.

The present invention may include a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer program product comprising a computer readable storage medium having program instructions embodied therewith, the program instructions executable by a processor to cause the processor to perform a method comprising:
    obtaining a data file that includes print instructions for instructing a three dimensional printer to print a three dimensional object, wherein the data file describes external surfaces of the object;
    providing user instructions for positioning a preformed structure so that the three dimensional printer can print the object around the preformed structure, wherein the preformed structure has a size and a shape to be subsumed within the external surfaces of the object;
    modifying the print instructions so that the printer will print the object around the preformed structure; and
    instructing the three dimensional printer to print material around the preformed structure using the modified print instructions to form the object.

2. The computer program product of claim 1, wherein printing material around the preformed structure reduces the amount of time required for the three-dimensional printer to form the object.

3. The computer program product of claim 1, wherein the user instructions are provided in response to determining that a remaining amount of print material available to form the object is less than required to form the object, or determining that the amount of time required to form the object is greater than a time setpoint.

4. The computer program product of claim 1, the method further comprising:
    maintaining an inventory of preformed structures that are available to be positioned in the three dimensional printer; and
    selecting one of the preformed structures from the inventory to be the preformed structure that is positioned into the three dimensional printer by identifying that the preformed structure has a size that can be subsumed within the object.

5. The computer program product of claim 4, wherein the preformed structure was previously printed on the three dimensional printer.

6. The computer program product of claim 5, wherein the preformed structure that was previously printed on the three dimensional printer is defective.

7. The computer program product of claim 1, wherein the user instructions include dimensions for user selection of a preformed structure that can be subsumed into the object.

8. The computer program product of claim 1, wherein the user instructions identify a position for placement of the preformed structure.

9. The computer program product of claim 1, wherein the user instructions are output to a display screen and include an illustration of a desired position for the preformed structure.

10. The computer program product of claim 1, wherein modifying the print instructions for printing the object to account for the preformed structure includes providing print instructions for printing around the preformed structure.

11. The computer program product of claim 1, wherein modifying the print instructions so that the printer will print the object around the preformed structure includes providing print instructions for forming an internal void in one portion of the object in response to positioning the preformed structure in another portion of the object.

12. The computer program product of claim 1, wherein modifying the print instructions so that the printer will print the object around the preformed structure includes providing print instructions for leaving voids in a portion of the object to offset additional weight of the preformed structure.

13. The computer program product of claim 1, wherein the preformed structure has a predetermined size and shape, and wherein the data file includes modified print instructions to account for presence of the preformed structure.

14. The computer program product of claim 1, the method further comprising:
   scanning the preformed structure after positioning the preformed structure in the three-dimensional printer to determine the actual positioning of the preformed structure, wherein instructing the three dimensional printer to print material around the preformed structure to form the object includes modifying control of the three-dimensional printer to adjust to the positioning of the preformed structure.

15. The computer program product of claim 1, wherein instructing the three dimensional printer to print material onto the preformed structure includes instructing the three dimensional printer to print material onto upward-facing and side-facing surfaces of the preformed structure.

16. The computer program product of claim 1, wherein instructing the three dimensional printer to print material onto the preformed structure includes instructing the three dimensional printer to print material onto surfaces of the preformed structure until the preformed structure is subsumed within the interior of the object.

17. The computer program product of claim 1, wherein the preformed structure is selected so that the object will have at least a minimum depth of printed material around the preformed structure.

18. The computer program product of claim 1, the method further comprising:
   instructing the three dimensional printer to print a base portion of the object prior to positioning the preformed structure into the three-dimensional printer on the base portion; and
   instructing the three dimensional printer to continuing to print the object after positioning the preformed structure into the three-dimensional printer on the base portion.

* * * * *